(12) United States Patent
Maenishi et al.

(10) Patent No.: US 9,880,548 B2
(45) Date of Patent: Jan. 30, 2018

(54) ELECTRONIC COMPONENT MOUNTING SYSTEM AND COMPONENT MANAGEMENT METHOD FOR ELECTRONIC COMPONENT MOUNTING SYSTEM

(71) Applicant: PANASONIC INTELLECTUAL PROPERTY MANAGEMENT CO., LTD., Osaka (JP)

(72) Inventors: Yasuhiro Maenishi, Yamanishi (JP); Norihisa Yamasaki, Yamanashi (JP); Yuji Nakamura, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 612 days.

(21) Appl. No.: 14/400,629

(22) PCT Filed: Feb. 21, 2013

(86) PCT No.: PCT/JP2013/000987
§ 371 (c)(1),
(2) Date: Nov. 12, 2014

(87) PCT Pub. No.: WO2013/175676
PCT Pub. Date: Nov. 28, 2013

(65) Prior Publication Data
US 2015/0134097 A1 May 14, 2015

(30) Foreign Application Priority Data
May 21, 2012 (JP) .................................. 2012-115303

(51) Int. Cl.
*G05B 19/418* (2006.01)
*H05K 13/08* (2006.01)

(52) U.S. Cl.
CPC .. *G05B 19/41805* (2013.01); *G05B 19/41865* (2013.01); *H05K 13/08* (2013.01);
(Continued)

(58) Field of Classification Search
None
See application file for complete search history.

(56) References Cited

U.S. PATENT DOCUMENTS 5,822,210 A * 10/1998 Kobayashi .............. H01L 22/20
257/E21.525
2003/0102367 A1* 6/2003 Monette ............. G05B 19/4183
235/376

(Continued)

FOREIGN PATENT DOCUMENTS

CN 1714611 A 12/2005
CN 101908166 A 12/2010

(Continued)

OTHER PUBLICATIONS

Chinese Office Action for Application No. 201380026902.6 dated Jun. 2, 2016.

(Continued)

*Primary Examiner* — Isaac T Tecklu
(74) *Attorney, Agent, or Firm* — Pearne & Gordon LLP

(57) ABSTRACT

Necessary component data indicative of the type and number of electronic components used in component mounting operation is obtained on the basis of production plan data, and mounting data in advance for each of production lots in advance. New allocation processing for allocating an electronic component necessary for production execution of a new production lot to be newly produced on an electronic component mounting line for the new production lot on the basis of the necessary unit data is executed, and component reservation processing for registering the allocation result in (Continued)

question as the inventory data is conducted by a unit reservation unit.

6 Claims, 9 Drawing Sheets

(52) U.S. Cl.
CPC ............... *G05B 2219/32117* (2013.01); *G05B 2219/45031* (2013.01); *Y02P 90/04* (2015.11); *Y02P 90/20* (2015.11)

(56) References Cited

U.S. PATENT DOCUMENTS

| | | | | |
|---|---|---|---|---|
| 2003/0125895 A1* | 7/2003 | Kawai | ................... | H05K 13/08 702/117 |
| 2004/0245112 A1* | 12/2004 | Sekimoto | ................. | C25D 5/08 205/133 |
| 2005/0115060 A1* | 6/2005 | Kondo | ............... | H05K 13/0061 29/650 |
| 2005/0190956 A1* | 9/2005 | Fujii | ................. | G01N 21/8851 382/141 |
| 2006/0085973 A1* | 4/2006 | Kodama | ................ | H05K 13/04 29/740 |
| 2008/0147232 A1* | 6/2008 | Kuribayashi | .......... | H05K 13/08 700/160 |
| 2009/0043414 A1* | 2/2009 | Maenishi | ............... | H05K 13/08 700/101 |
| 2009/0250313 A1* | 10/2009 | Kimura | ............. | H05K 13/0061 198/465.1 |
| 2009/0293265 A1* | 12/2009 | Inoue | .................... | H05K 13/08 29/739 |
| 2010/0152877 A1* | 6/2010 | Maenishi | ........... | H05K 13/0413 700/108 |
| 2010/0325860 A1* | 12/2010 | Maenishi | ............... | H05K 13/08 29/407.01 |
| 2011/0017080 A1* | 1/2011 | Miyahara | ............ | B41F 15/0818 101/123 |
| 2011/0225811 A1 | 9/2011 | Kodama et al. | | |
| 2011/0302776 A1* | 12/2011 | Kato | .................... | H05K 13/0452 29/829 |
| 2012/0246929 A1* | 10/2012 | Nakamura | .......... | H05K 13/0452 29/834 |
| 2012/0253499 A1* | 10/2012 | Nakamura | .......... | H05K 13/0417 700/121 |
| 2012/0311854 A1* | 12/2012 | Yamauchi | ........... | H05K 13/0452 29/729 |
| 2012/0314395 A1* | 12/2012 | Yamauchi | .......... | H05K 13/0061 361/837 |
| 2013/0047427 A1* | 2/2013 | Yagi | ................... | H05K 13/0434 29/832 |
| 2013/0118006 A1* | 5/2013 | Kinoshita | ........... | H05K 13/0061 29/739 |
| 2013/0129468 A1* | 5/2013 | Kawaguchi | ............ | H05K 13/08 414/806 |
| 2013/0247368 A1* | 9/2013 | Kawase | ............. | H05K 13/0452 29/832 |
| 2013/0247369 A1* | 9/2013 | Kawase | ............. | H05K 13/0452 29/832 |
| 2014/0026410 A1 | 1/2014 | Kodama et al. | | |
| 2014/0090244 A1* | 4/2014 | Sakamoto | .......... | H05K 13/0452 29/832 |
| 2014/0230241 A1* | 8/2014 | Yamasaki | ............. | H05K 13/08 29/739 |
| 2015/0230344 A1 | 8/2015 | Kodama et al. | | |

FOREIGN PATENT DOCUMENTS

| | | |
|---|---|---|
| CN | 101938895 A | 1/2011 |
| JP | 10-229293 A | 8/1988 |
| JP | 10-34459 A | 2/1998 |
| JP | 2000-059090 A | 2/2000 |
| JP | 2004-326298 A | 11/2004 |
| JP | 2009-224764 A | 10/2009 |

OTHER PUBLICATIONS

Chinese Search Report for Application No. 201380026902.6 dated Jun. 2, 2016.

* cited by examiner

*FIG. 2A*

INVENTORY DATA REFERENCE SCREEN (UNIT)

| ID | TYPE | RESERVATION STATUS |
|---|---|---|
| 0001 | 110 | PRODUCTION LOT 01 — PRODUCTION LOT 04 |
| 0002 | 110 | PRODUCTION LOT 01 |
| 0003 | 110 | PRODUCTION LOT 02 |
| 0004 | 115 | PRODUCTION LOT 01 |
| 0005 | 115 | PRODUCTION LOT 02 |
| 0006 | 115 | PRODUCTION LOT 03 |

Tabs: NOZZLE / FEEDER

*FIG. 2B*

INVENTORY DATA REFERENCE SCREEN (COMPONENT)

| ID | COMPONENT NAME | THE NUMBER OF REMAINING COMPONENTS | LOCATION INFORMATION | RESERVATION STATUS |
|---|---|---|---|---|
| 0001 | A | 1400 | ***** | |
| 0002 | A | 2000 | ***** | |
| 0003 | A | 2000 | ***** | |
| 0004 | A | 3000 | ***** | |
| 0005 | B | 3000 | ***** | |
| 0006 | B | 1500 | ***** | |
| 0007 | B | 1500 | ***** | |
| 0008 | B | 1500 | ***** | |
| 0009 | C | 3000 | ***** | |
| 0010 | C | 2500 | ***** | |

FIG. 3A

UNIT MANAGEMENT DATA (USE LIMIT)

| NOZZLE / FEEDER | | | |
|---|---|---|---|
| TYPE | THE NUMBER OF ADSORPTIONS | ADSORPTION ERROR RATE | MAXIMUM MAINTENANCE INTERVAL THE NUMBER OF DAYS/TIME |
| 110 | 1,000,000 | **% | 600H |
| 112 | 1,000,000 | **% | 600H |
| 113 | 1,000,000 | **% | 600H |
| 114 | 1,000,000 | **% | 600H |
| 115 | 500,000 | **% | 300H |
| 116 | 1,000,000 | **% | 800H |

FIG. 3B

UNIT MANAGEMENT DATA (USE HISTORY)

| NOZZLE / FEEDER | | | | | |
|---|---|---|---|---|---|
| TYPE | ID | Tag | THE NUMBER OF CURRENT ADSORPTIONS | ADSORPTION ERROR RATE | ELAPSED DAYS/TIME FROM PREVIOUS MAINTENANCE |
| 110 | 0032 | ABSENT | 496,184 | **% | 122H |
| 110 | 0033 | ABSENT | 208,003 | **% | 121H |
| 110 | 0034 | ABSENT | 668,398 | **% | 309H |
| 110 | 0035 | ABSENT | 802,230 | **% | 401H |
| 110 | 0036 | ABSENT | 25,786 | **% | 583H |
| 110 | 0037 | PRESENT | 458,221 | **% | 617H |
| 112 | 0123 | ABSENT | 802,020 | **% | 98H |
| 112 | 0127 | ABSENT | 224,974 | **% | 104H |
| 112 | 0132 | ABSENT | 13,539 | **% | 73H |

ELECTRONIC COMPONENT MOUNTING SYSTEM AND COMPONENT MANAGEMENT METHOD FOR ELECTRONIC COMPONENT MOUNTING SYSTEM

TECHNICAL FIELD

The present invention relates to an electronic component mounting system that mounts an electronic component on a substrate, and a component management method in the electronic component mounting system for managing the electronic components used in the electronic component mounting system.

BACKGROUND ART

In an electronic component mounting system that mounts an electronic component on a substrate to manufacture a mounting substrate, because a large variety of electronic components are mounted on plural types of substrates, a large variety and an enormous number of electronic components are prepared and saved in a component supply section. The saving configuration of the electronic components is varied according to a production system of individual production sites, and according to the type of the respective electronic components. For example, the electronic components that have a specified function, and are expensive and low in use frequency are allocated at an initial time of the production plan, individually. On the other hand, general-purpose components such as general-purpose memories or RC components, which are used in large numbers regardless of the substrate type, are not allocated for each of products, but treated as regular stock components that are always stocked in appropriate numbers.

In the field of electronic component mounting, a large variety of components are used as the regular stock components, and it is extremely important to appropriately manage the use and stock of the regular stock components from the viewpoint of a reduction in the production costs. For that reason, up to now, there has been introduced a management system that compiles a database containing a variety of information on the components on an electronic component mounting line, for example, a stock component management file to automatically create NC data used in the mounting operation, or setup instructions for combining a component supply reel and a tape feeder together in advance (for example, refer to Patent Literature 1). In the prior art disclosed in this Patent Literature example, spot components such as the component supply reel that holds electronic components, and the tape feeder in which the component supply reel is loaded are identified by an identifying means such as bar codes, individually, and delivery operation and the setup operation are executed on the basis of the above identification information. As a result, the component stock state is correctly grasped, and the setup operation is efficiently conducted.

CITATION LIST

Patent Literature

Patent Literature 1: JP-A-10-034459

SUMMARY OF THE INVENTION

Problems to be Solved by the Invention

However, in the conventional art disclosed in the above-mentioned Patent Literature, there arises the following disadvantages when the component mounting operation is executed on a plurality of production lots. That is, in the conventional art, the setup instructions referred to when actually executing the operation are prepared for each type of the substrates to be produced. When a plurality of production lots is present for the same substrate type in a production plan at the same mounting operation site, or in general-purpose components shared with a plurality of substrate types, the components are not always correctly allocated to all of scheduled production lots. For that reason, even if the operation is intended to be conducted according to the setup instructions, the scheduled component is diverted for another production lot, and a required number of components are missing, as a result of which the component mounting operation according to the production plan cannot be executed. In this way, the conventional electronic component mounting system suffers from such a problem that the electronic components used in the component mounting operation are not appropriately managed, thereby making it difficult to correctly determine whether the production plan can be executed, or not.

Under the circumstances, the present invention aims at providing an electronic component mounting system that can appropriately manage the electronic components used in the component mounting operation to correctly determine whether the production plan can be executed, or not, and a component management method in the electronic component mounting system.

Means for Solving the Problems

An electronic component mounting system according to an embodiment of the invention for mounting an electronic component on a substrate to manufacture a mounting substrate comprises:

an electronic component mounting line configured to execute component mounting operation for mounting the electronic component;

a production plan data storage unit configured to store production plan data including at least a type of substrate, a production time, and number of productions for each production lot of the mounting substrate to be produced on the electronic component mounting line for a plurality of the production lots;

a mounting data storage unit configured to store mounting data indicative of a type and number of the electronic components used in the component mounting operation for each type of the substrates therein;

a necessary component data creating means for obtaining necessary component data indicative of a type and number of the electronic components used in the component mounting operation on the basis of the production plan data and the mounting data for each of the production lots;

an inventory data storage unit configured to store therein inventory data indicative of a stock status of the electronic components; and a component reservation unit configured to execute new allocation processing of allocating electronic components necessary for production execution of the new production lot to be newly produced on the electronic component mounting line for the new production lot on the basis of the necessary component data, and conduct component reservation processing for registering allocated results in the inventory data storage unit.

A component management method in an electronic component mounting system according to an embodiment of the invention for mounting an electronic component on a substrate to manufacture a mounting substrate, which manages an electronic component used in component mounting operation, comprises: an electronic component mounting line configured to execute component mounting operation for mounting the electronic component; a production plan data storage unit configured to store production plan data including at least a type of substrate, a production time, and number of productions for each production lot of the mounting substrate to be produced on the electronic component mounting line for a plurality of the production lots; a mounting data storage unit configured to store therein mounting data defining a type and number of the electronic components used in the component mounting operation for each type of the substrates; a necessary component data creating means for obtaining necessary component data indicative of a type and number of the electronic components used in the component mounting operation on the basis of the production plan data and the mounting data for each of the production lots; and an inventory data storage unit configured to store inventory data indicative of a stock status of the electronic components therein, wherein component reservation processing for executing new allocation processing of allocating the electronic component necessary for production execution of new production lot to be newly produced on the electronic component mounting line for the new production lot on the basis of the necessary component data is conducted, and component reservation processing for registering the allocation results in the inventory data storage unit is conducted.

Advantage of the Invention

According to the present invention, necessary component data indicative of the type or number of electronic components used in the component mounting operation is obtained for each of production lots on the basis of the production plan data and the mounting data, new allocation processing for allocating the electronic components necessary for production execution of the new production lot to be newly produced on the electronic component mounting line for the new production lot on the basis of the necessary component data is executed, and component reservation processing for registering the allocation results in an inventory data storage unit is conducted, as a result of which the electronic components used in the component mounting operation can be appropriately managed to correctly determine whether the production plan can be executed, or not.

BRIEF DESCRIPTION OF DRAWINGS

FIGS. 2A and 2B are diagrams illustrating a reference screen of inventory data stored in a storage unit of the electronic component mounting system according to the embodiment of the present invention.

FIGS. 3A and 3B are diagrams illustrating a reference screen of unit management data stored in the storage unit of the electronic component mounting system according to the embodiment of the present invention.

MODE FOR CARRYING OUT THE INVENTION

Figure 1:
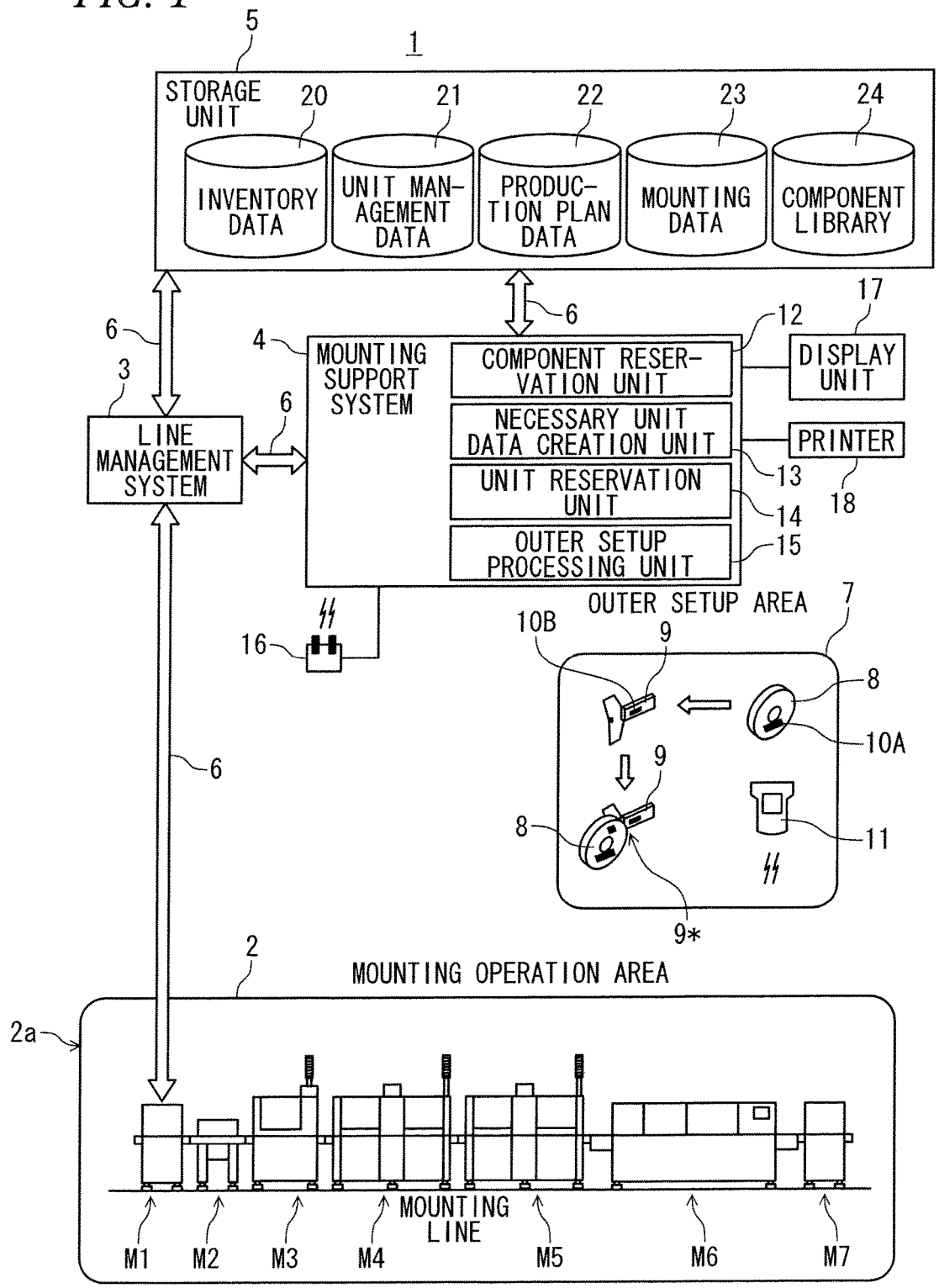
FIG. 1 is an illustrative view of a configuration of an electronic component mounting system according to an embodiment of the present invention.

Subsequently, an embodiment of the present invention will be described with reference to the drawings. First, referring to FIG. 1, a configuration of an electronic component mounting system 1 will be described. The electronic component mounting system 1 has a function of mounting an electronic component on a substrate to produce a mounting substrate, and in a mounting operation area 2 is arranged an electronic component mounting line 2a in which a substrate supply device M1, a substrate delivery device M2, a solder printing device M3, a first electronic component mounting device M4, a second electronic component mounting device M5, a reflow device M6, and a substrate recovery device M7 are coupled in series with each other.

In the component mounting operation executed by the electronic component mounting line 2a, a substrate supplied by the substrate supply device M1 is carried in the solder printing device M3 through the substrate delivery device M2 in which a solder printing operation for screen-printing a component joining solder on the substrate is conducted. The substrate that has been screen-printed is sequentially delivered to the first electronic component mounting device M4 and the second electronic component mounting device M5 in which the component mounting operation for mounting the electronic component on the solder printed substrate is executed. Then, the substrate on which the component has been mounted is carried in the reflow device M6 in which the component joining solder is melted and solidified by heating according to a given heating profile. As a result, a mounting substrate in which the electronic component is joined to the substrate by soldering to mount the electronic component on the substrate is completed, and recovered to the substrate recovery device M7.

The electronic component mounting system 1 includes a line management system 3, a mounting support system 4, and a storage unit 5. Those respective units are connected to each other through a communication network 6 to enable data transfer between the respective units. The line management system 3 manages component mounting operation conducted on the electronic component mounting line 2a arranged in the mounting operation area 2. The mounting support system 4 conducts a mounting support operation for preparing a required electronic component, and equipment units such as a nozzle and a parts feeder which are used in the component mounting operation prior to the execution of the component mounting operation. The storage unit 5 stores data necessary for execution of various processing by the line management system 3 and the mounting support system 4 therein. In the following description, the electronic component, the parts feeder (tape feeder), and the equipment units may be abbreviated to "component", "feeder", and "units", respectively.

The electronic component mounting system 1 includes an outer setup area 7 for conducting a given setup operation on the electronic component delivered from a component storage area (outside the drawing). A component to be mounted is supplied to the electronic component mounting line 2a after the outer setup operation has been conducted in the outer setup area 7. In this embodiment, the setup operation of the reel 8 for setting the reel 8 in a feeder 9 (tape feeder) having a function of pitch feeding a carrier tape which is supplied in a state where the carrier tape is wound on a reel 8 in advance before the device installation corresponds to the outer setup operation.

That is, in the outer setup area 7, feeder setup operation of setting the reel 8 delivered from the component storage area in the feeder 9 as a unit to configure a component supply unit 9\* is conducted. Then, the component supply unit 9\* after the feeder setup operation is supplied to the first electronic component mounting device M4 and the second electronic component mounting device M5 on the electronic component mounting line 2a.

The mounting support system 4 includes a component reservation unit 12, a necessary unit data creation unit 13, a unit reservation unit 14, and an outer setup processing unit 15 as an internal processing function. Also, the mounting support system 4 includes a display unit 17 for displaying and outputting a variety of screens, and a printer 18 for printing and outputting a variety of data. As a result, the mounting support system 4 can output data processing results, and the variety of data stored in the storage unit 5 as occasion demands. Further, the mounting support system 4 includes a receiving device 16 that receives data input from a portable input terminal such as a bar code reader 11 operated in an accessory area of the electronic component mounting system 1 such as the outer setup area 7 or the component storage area.

In the feeder setup operation in the outer setup area 7, bar code data written on a bar code label 10A stuck on the reel 8 as component identification information, and bar code data written on a bar code label 10B stuck on the feeder 9 as unit identification information are read by the bar code reader 11, and the read results are transmitted to the receiving device 16 provided in the mounting support system 4 by a wireless LAN function. Therefore, the bar code reader 11 and the receiving device 16 configure an identification information read unit that reads the component identification information for identifying and specifying the electronic component, and the unit identification information for identifying and specifying the equipment unit.

The storage unit 5 stores inventory data 20, unit management data 21, production plan data 22, mounting data 23, and a component library 24 therein, and configurations of those pieces of data will be described below. The inventory data 20 is data indicative of a stock status of the units, and an allocation status in an actual production plan which is used in the components and the component mounting operation on the electronic component mounting line 2a. This embodiment illustrates an example in which the feeder 9 that supplies the component to the electronic component mounting line 2a, or the nozzle that adsorbs and holds the component is to be managed as the units. Units other than the nozzle and the feeder may be managed if the units are exchangeably used in the component mounting operation.

An actual example of the inventory data 20 will be described with reference to FIGS. 2A and 2B. FIG. 2A illustrates an example in which the inventory data 20 for the above-mentioned unit is displayed on a display screen 17a of the display unit 17 as a reference screen. In this example, two types of nozzle inventory data 20A listed up for the nozzle as the unit, and feeder inventory data 20B listed up for the feeder are switchably displayed on the display screen 17a. On the display screen 17a are set cursors 17b and 17c for screen scroll, and the cursors 17b and 17c are operated so that a display range within the display screen 17a can be scrolled in columns and rows.

The nozzle inventory data 20A represents a data configuration that associates "ID" 20a (0001, 0002, . . . ) allocated for specifying a plurality of nozzles, individually, with "type" 20b (110, 115, . . . ) indicative of an attribute such as the type or size of the nozzle, and "reservation status" 20c. In this example, one row corresponds to one individual nozzle, and in a column of "reservation status" 20c, a row direction (lateral direction) corresponds to a time axis. In the "reservation status" 20c, a scheduled production lot 22N (N=01, 02, . . . ) (refer to FIG. 4A) in which the nozzle is used is displayed in time series with a production time corresponding to a time axis.

For example, the nozzles having "ID 20a of "0001", "0002", and "0004" are allocated and reserved so as to be used in the component mounting operation intended for the production lots indicated by "production plan 01". Each of the production lots 22N at the "reservation status" 20c is displayed as a band chart with a start point and an end point corresponding to a start date 22a and an end date 22b indicative of the production time in the production plan data 22 illustrated in FIG. 4A. Likewise, the feeder inventory data 20B represents a data configuration that associates "ID" 20a allocated for specifying a plurality of feeders, individually, with "type" 20b indicative of an attribute such as the type of the feeder, and "reservation status" 20c in which a scheduled production lot 22N in which the feeder is used is displayed in time series. That is, the allocation results registered in the storage unit 5 as the production plan data 22 includes information on the reserved production lot and the production time of the production lot.

FIG. 2B illustrates an example in which the component inventory data 20C intended for the reel 8 that stores the component is displayed on the display screen 17a of the display unit 17. Likewise, in this example, the cursors 17b and 17c are operated so that a display range within the display screen 17a can be scrolled in columns and rows. The component inventory data 20C represents a data configuration that associates "ID" 20d (0001, 0002, . . . ) allocated for specifying a plurality of reels 8, individually, with a component name 20e (A, B, . . . ), "the remaining number" 20f, "location information" 20g indicative of the remaining number of components stored in the reel 8, and a location place of the reel 8, respectively, and "reservation information" 20h.

In this example, one row corresponds to one individual reel 8, and in a column of "reservation information" 20h, a row direction (lateral direction) corresponds to a time axis. In the "reservation information" 20h, as in the example illustrated in FIG. 2A, the scheduled production lot 22N (refer to FIG. 4A) in which the component is used is displayed in time series. A production lot 22N\* indicated in "reservation information" 20h represents the production lot 22N in which the reel 8 of a component name 8 when "ID" 20d is "0008" is newly allocated by the component reservation processing (refer to FIG. 6).

The unit management data 21 is data for managing the units loaded on the electronic component mounting line 2a in the component mounting operation in use, individually. In this embodiment, as with the inventory data 20, in the unit management data 21, the feeder that supplies the component as the unit, and the nozzle that adsorbs and holds the component are to be managed. The unit management data 21 includes, as the data content, use limit data that defines the use limit for each type of the units, use history data indicative of the individual use history of the units, and availability information indicative of the individual availability state of the units by presence or absence of Tag. The use history data and the use limit data includes any one of the number of adsorption, an adsorption error rate, and an elapsed time or the number of days from a previous maintenance.

An actual example of the unit management data 21 will be described with reference to FIGS. 3A and 3B. FIG. 3A illustrates an example in which the use limit data that defines the use limit for each type of the units among the unit management data 21 intended for the above-mentioned unit is displayed on the display screen 17a of the display unit 17. In this example, two types of nozzle use limit data 21A intended for the nozzle as the unit and feeder use limit data 21B intended for the feeder are switchably displayed on the display screen 17a. As with the example illustrated in FIG. 2A, the cursors 17b and 17c are operated so that a display range within the display screen 17a can be scrolled in columns and rows.

The nozzle use limit data 21A represents a data configuration that associates "type" 21a (110, 112, . . . ) indicative of an attribute such as the type or size of the nozzle with "the number of adsorption" 21b indicative of an upper limit of the number of use allowed for the nozzle of the type, "adsorption error rate" 21c indicative of an upper limit frequency of the adsorption error allowed in a normal use state, and "maximum maintenance interval (the number of days/time) 21d indicative of an interval during which the use is allowed without maintenance. In this example, one row corresponds to one nozzle type, and the use limit is set for "type" 21a of all types assumed to be used in the electronic component mounting system 1 in advance, and stored as the unit management data 21.

Likewise, the feeder use limit data 21B represents a data configuration that associates "type" 21a indicative of an attribute such as the type of the feeder with "the number of adsorption" 21b indicative of the upper limit of the number of use allowed for the nozzle of the type, "adsorption error rate" 21c indicative of an upper limit frequency of the adsorption error allowed in the normal use state, and "maximum maintenance interval (the number of days/time) 21d indicative of an interval during which the use is allowed without maintenance.

FIG. 3B illustrates an example in which the use history data indicative of the individual use history of the units among the unit management data 21 intended for the above-mentioned units is displayed on the display screen 17a of the display unit 17. Likewise, in this example, two types of nozzle use history data 21C intended for the nozzle as the unit and feeder use history data 21D intended for the feeder are switchably displayed on the display screen 17a.

The nozzle use history data 21C represents a data configuration that associates "type" 21f (110, 112, . . . ) indicative of an attribute such as the type or size of the nozzle with "ID" 21 allocated for specifying a plurality of nozzles, individually, "Tag" 21h (availability information) indicative of the availability state of the nozzles by presence or absence of Tag, "the number of current adsorption" 21i indicative of the number of adsorption operation actually conducted till the time point in the component mounting operation, "adsorption error rate" 21j indicative of the frequency of adsorption errors actually generated in the adsorption operation by the nozzle, and "elapsed day/time from the previous maintenance" 21k. In this example, one row corresponds to one "ID" 21g, and those use histories are acquired for all of the nozzles used in the electronic component mounting system 1, and stored as the unit management data 21.

In the unit management in the electronic component mounting system 1 according to this embodiment, when the use history data of the unit acquired in the actual component mounting operation arrives at the use limit data defined by the production plan data 22 in advance, the availability information of the unit is set as unavailability. For example, in the nozzle use history data 21C illustrated in FIG. 3B, in the nozzle where "ID" 21g is "0037", and "type" 21f is 110, an actual value (617H) of "elapsed days/time from the previous maintenance" 21k has already exceeded a defined value (600 H) of "maximum maintenance interval (the number of days/time)" 21d defined in the nozzle type 110 by the use limit data illustrated in FIG. 3A. Therefore, "Tag" 21h which is the availability information on the nozzle is set to "presence" indicative of the unavailability. If any one of the number of adsorption, the adsorption error rate, and the elapsed time or the number of days from the previous maintenance arrives at the use limit data defined in the nozzle use limit data 21A and the feeder use limit data 21B, "Tag" 21h which is similarly the unavailability information is set to presence indicative of the unavailability.

Likewise, the feeder use history data 21D represents a data configuration that associates "type" 21f indicative of an attribute such as the type of the feeder with "ID" 21g allocated for specifying a plurality of nozzles, individually, "Tag" 21h (availability information) indicative of the availability state of the feeder by presence or absence of Tag, "the number of current adsorption" 21i indicative of the number of adsorption operation actually conducted till the time point in the component mounting operation, "adsorption error rate" 21j indicative of the frequency of adsorption errors actually generated in the adsorption operation by the feeder, and "elapsed day/time from the previous maintenance" 21k. Likewise, one row corresponds to one "ID" 21g, and those use histories are acquired for all of the feeders used in the electronic component mounting system 1, and stored as the unit management data 21.

Figure 4A:
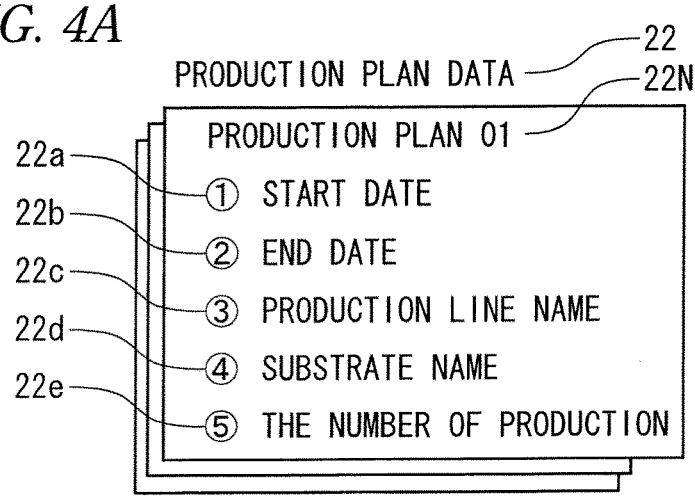
FIGS. 4A to 4C are illustrative diagrams of configuration of production plan data, mounting data, and a component library stored in the storage unit of the electronic component mounting system according to the embodiment of the present invention.
Figure 4B:
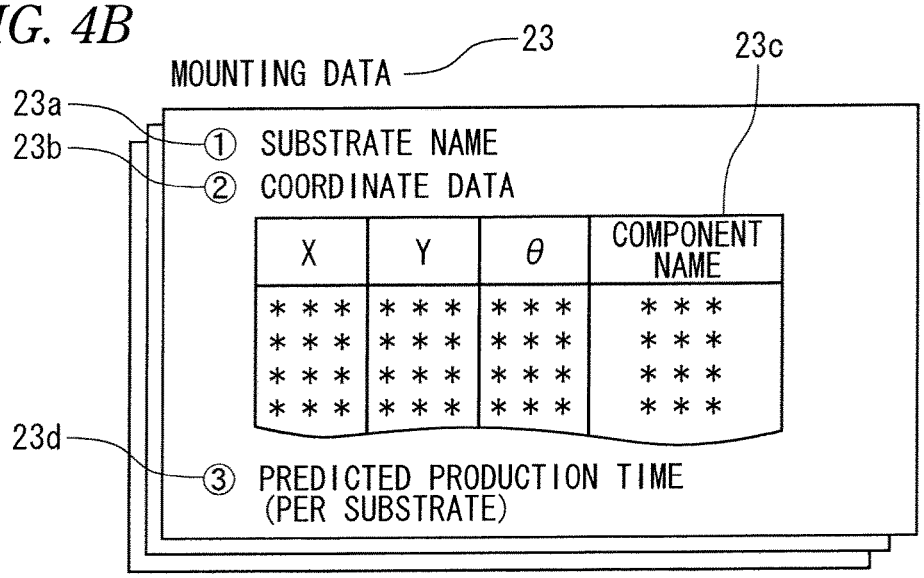
Figure 4C:
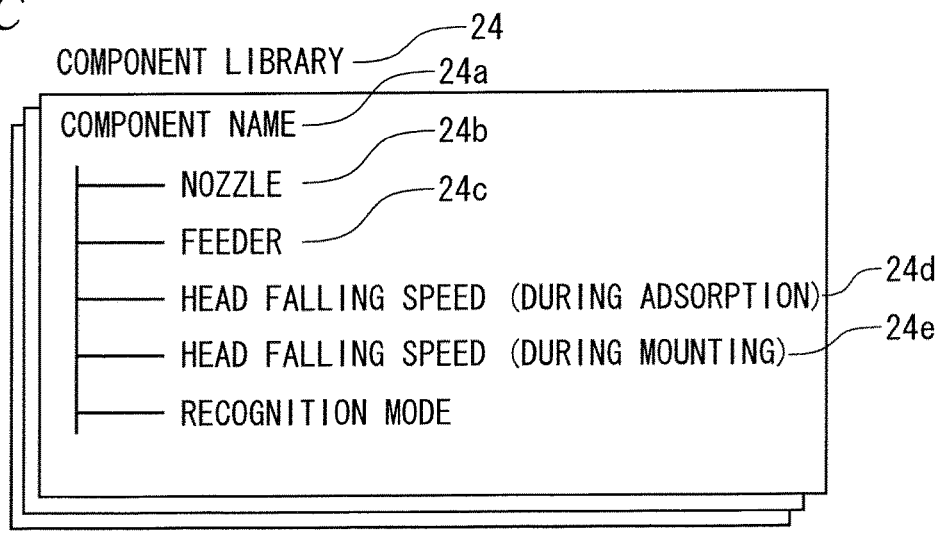

Subsequently, the production plan data 22, the mounting data 23, and the component library 24 will be described with reference to FIGS. 4A to 4C. The production plan data 22 includes at least the production time and the number of productions for each production lot of the mounting substrates to be produced by the electronic component mounting line 2a, and the production plan data 22 on the plurality of production lots is stored in the storage unit 5. That is, as illustrated in FIG. 4A, the production plan data 22 defines the start date 22a, the end date 22b, a production line name 22c, a substrate name 22d, and the number of productions 22e for each of the production lots 22N specified by consecutive number of code.

The mounting data 23 is data directly used for execution of the component mounting operation such as the type, the mounting position, and the number of components used in the component mounting operation, and stored in the storage unit 5 for each type of the substrates defined in the production plan data 22. That is, as illustrated in FIG. 4B, the mounting data 23 is configured so that "predicted production time" 23d is added to "substrate name" 23a indicative of the substrate type, and "coordinate data" 23b indicative of position coordinates in the respective directions of X, Y, and θ in correspondence with "component name" 23c of each component mounted on the substrate. The "predicted production time" 23d is obtained by estimating a time required for the component mounting operation intended for one substrate.

The component library 24 is adaptation information indicative of a conformity of the unit loaded in the electronic component mounting device in combination with the component, and the component, and stored in the storage unit 5 for each of the plural components. That is, as illustrated in FIG. 4C, in the component library 24, the "component name" 24a of each component is linked with the "nozzle" 24b and the "feeder" 24c which are conformable with the component, and associated with "head falling speed (during adsorption)" 24d, "head falling speed (during mounting)" 24e which are indicative of an appropriate operation speed, and "recognition mode" 24f.

In the above configuration, the storage unit 5 includes an inventory data storage unit, a unit management data storage unit, a production plan data storage unit, a mounting data storage unit, and a component library storage unit, which store the inventory data 20, the unit management data 21, the production plan data 22, the mounting data 23, and the component library 24 of the above-mentioned contents, respectively.

Subsequently, various processing for supporting the mounting which is executed by the mounting support system 4 in the component mounting operation of the electronic component mounting system 1 will be described with reference to processing flows illustrated in FIGS. 5 to 9. First, a component reservation function by the component reservation unit 12 which is used in a component management method of the electronic component mounting system 1 will be described with reference to FIGS. 5 and 6. That is, the component reservation unit 12 has a function of executing the new allocation processing for allocating a component necessary for production execution of a new production lot to be newly produced in the electronic component mounting line 2a for the new production lot on the basis of the necessary component data, and conducting the component reservation processing for registering the allocation results as the inventory data 20 in the storage unit 5.

In the component reservation processing, calculation for obtaining the necessary component data indicative of the type and number of components used in the component mounting operation for each of the production lots on the basis of the production plan data 22 and the mounting data 23 is executed. Therefore, the component reservation unit 12 functions as a necessary component data creating means for obtaining the necessary component data for each of the production lots on the basis of the production plan data 22 and the mounting data 23.

Information on the reserved production lot and the production time on the production lot is included in the allocation results of the production plan data 22 registered in the storage unit 5 (refer to FIGS. 2A and 2B). In the new allocation processing for the above-mentioned new production lot by the necessary unit data creation unit 13, it is determined whether another production lot is present, overlapping in the production time of the new production lot, or not, and the component reservation processing is conducted only when there is no overlapping production lot. Also, if allocatable component is absent in the inventory data 20 in the new allocation processing, the component reservation unit 12 conducts processing of outputting a list indicative of missing components necessary for completing the production of the new production lot together.

Figure 5:
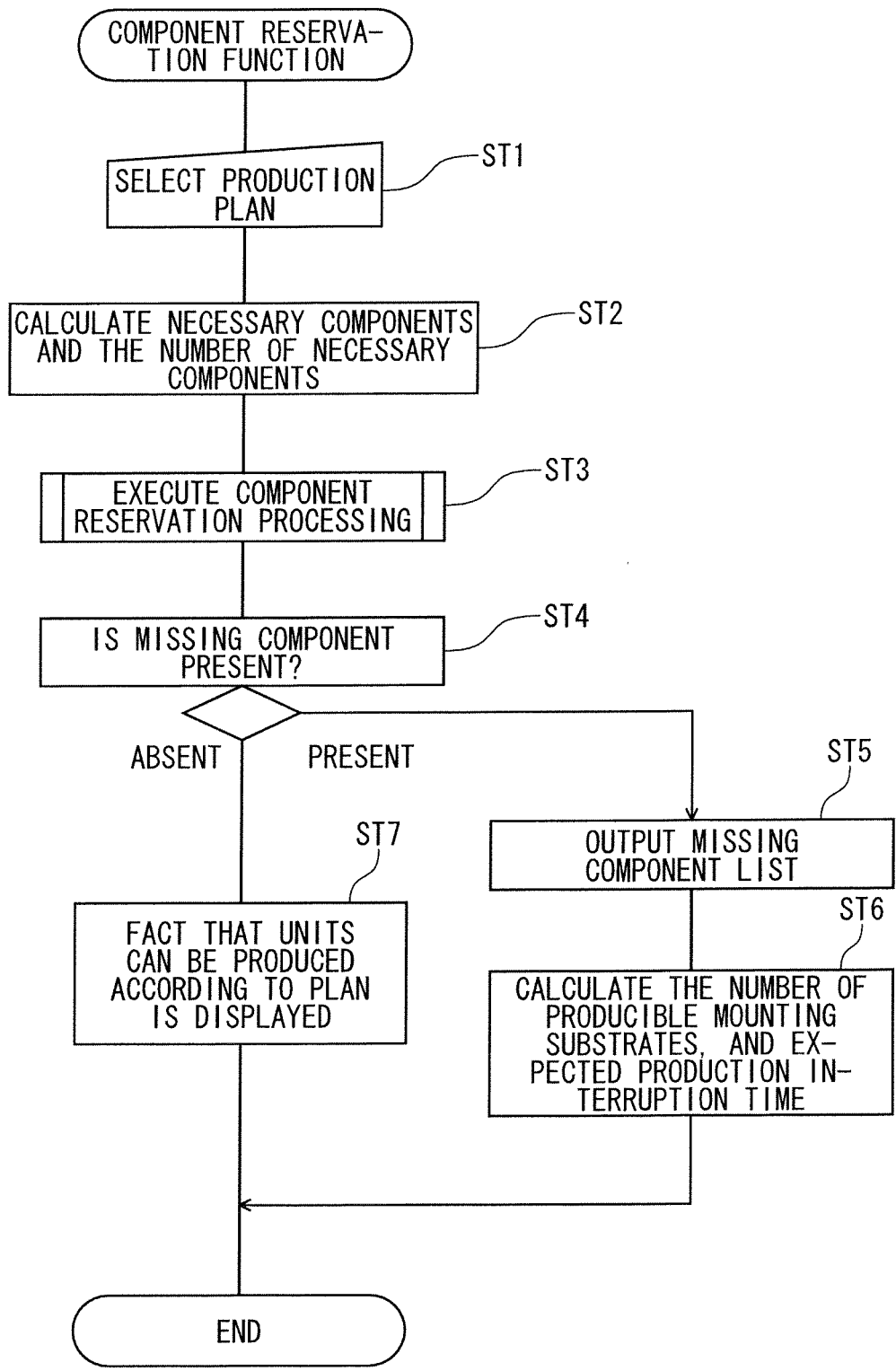
FIG. 5 is a flowchart illustrating a component reservation function in the electronic component mounting system according to the embodiment of the present invention.

Now, the component reservation function executed by the component reservation unit 12 will be described with reference to FIG. 5. First, the production plan to be subjected to the component reservation processing is selected with reference to the production plan data 22 stored in the storage unit 5 (ST1). As a result, the production lot 22N illustrated in FIG. 4A is specified, and the respective data items of the "start date" 22a to "the number of productions" 22e in the component mounting operation intended for the production lot are acquired.

Subsequently, the necessary component data, that is, the necessary components and the necessary number of components are calculated on the basis of the production plan data 22 and the mounting data 23 (ST2). The calculation processing is conducted by creating the necessary component list that lists up the number of components necessary for each type of the components necessary in the production lot. In this calculation processing, the necessary number of components for one substrate is obtained for each type of the components from the list of the "component name" 23c of the components mounted on the substrate of the substrate name with reference to the mounting data 23 corresponding to the "substrate name" 22d given by the production plan data 22, and the necessary number of components is multiplied by "the number of productions" 22e indicative of the production plan data 22, to thereby obtain the necessary number of necessary components required for the component mounting operation intended for the production lot as the necessary component data. The above calculation processing is conducted by the component reservation unit 12 that functions as a necessary component data creating means.

Then, the component reservation processing is executed by the component reservation unit 12 (ST3). In this example, the new allocation processing for allocating the components necessary for the production execution of the new production lot to be newly produced for the new production lot on the basis of the necessary component data obtained in (ST2) is executed, and the component reservation processing for registering the allocation results as the inventory data 20 (refer to FIGS. 2A and 2B) in the storage unit 5 is conducted.

Figure 6:
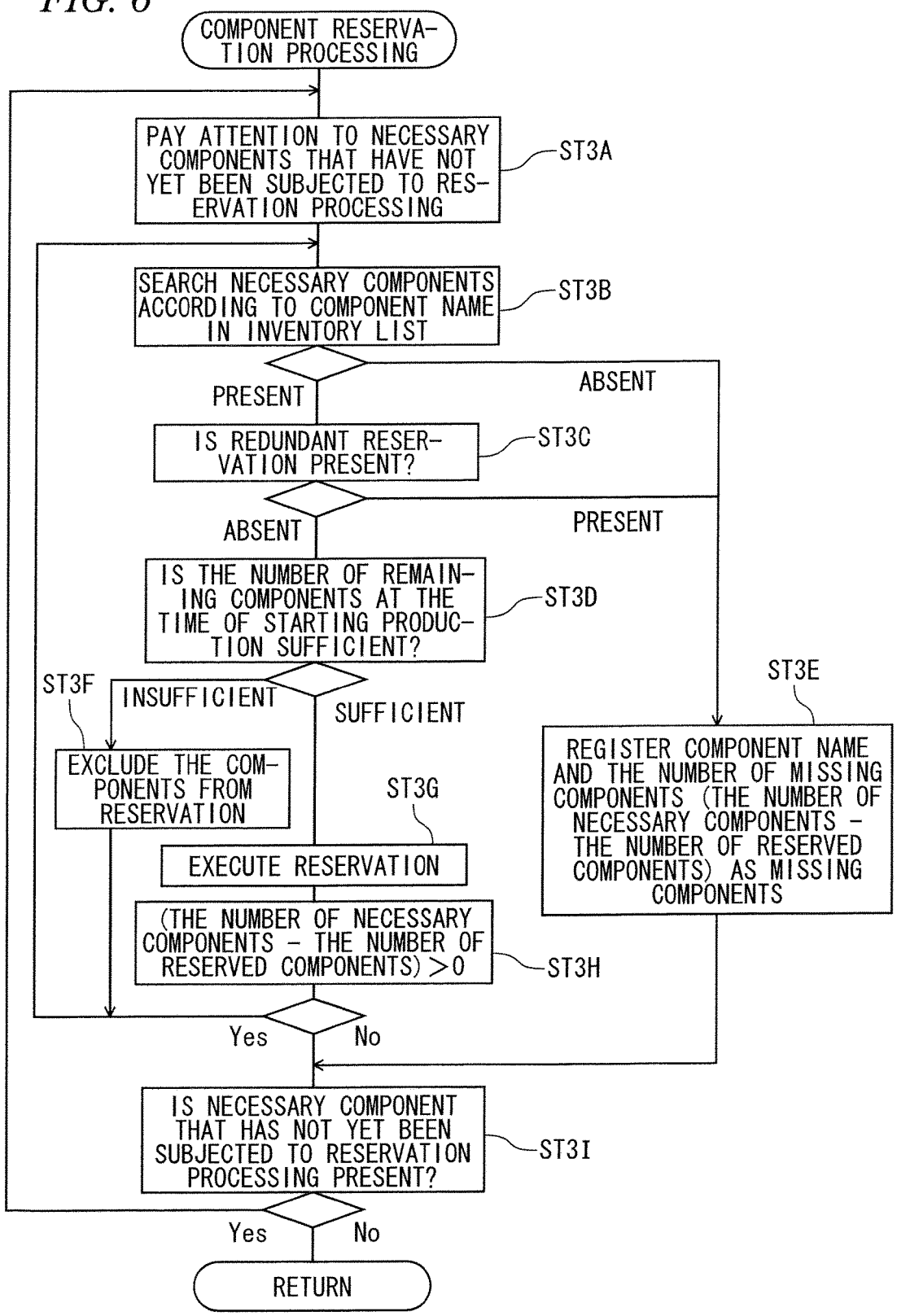
FIG. 6 is a flowchart illustrating the component reservation function in the electronic component mounting system according to the embodiment of the present invention.

Now, details of the component reservation processing executed in (ST3) will be described with reference to a flow of FIG. 6. First, referring to the above-mentioned necessary component list, attention is paid to the necessary components whose reservation has not yet been completed, and the component to be subjected to the component reservation processing is specified (ST3A). Then, referring to the production plan data 22, the component to be subjected to the reservation processing is searched by the component name in the component inventory data 20C illustrated in FIG. 2B (ST3B). In this example, the component having an ID which has already been reserved, or excluded from the reservation is excluded to conduct the search.

If it is found that the component to be subjected to the reservation processing is described in the component inventory data 20C by the search result, it is determined whether a overlapping reservation is present, or not (ST3C). That is, it is checked whether the component is reserved in another production lot 22N whose production time is overlapping in a time zone from the "start date" 22a to the "end date" 22b of the production lot 22N in which the use of the component has been reserved, or not. In this example (ST3B), if the component is not described in the component inventory data 20C, or if it is determined that there is a overlapping reservation in (ST3C), it is determined that there is a possibility of missing component occurrence that the components to be reserved are missing in execution of the component mounting operation according to the production plan, and the component name and the number of missing components (the number of necessary components–the number of reserved components) are registered (ST3E).

In this situation, if the component is not described in the component inventory data 20C, since the reserved number of components is 0, the necessary number of components becomes the number of missing components as it is. Also, if it is determined that an overlapping reservation is present in (ST3C), a number obtained by subtracting the number of reserved components from the number of necessary components in the production lot 22N mutually overlapping becomes the number of missing components. In this example, the number of reserved components represents the number of components registered in the component inventory data 20C by the component reservation processing, and is expected to be stocked. In this example, the number of registered components is to be described in a missing component list which will be described later.

Also, if no overlapping reservation is present in (ST3C), it is determined whether the number of remaining components at the time of starting the production of the production lot 22N is sufficient, or not, with reference to "the number of remaining components" 20f of the component inventory data 20C (ST3D). The determination of whether the number of remaining components is sufficient, or not, is conducted by comparing "the number of remaining components" 20F with a predefined reference number, and a value with an expected margin is normally set as the reference number. When the components are intended to be used in the component mounting operation from the production start time point even if the number of remaining components is small, the reference numeral has only to be set to 0.

If it is determined that the number of remaining components is sufficient in (ST3D), reservation processing of allocating the component to a new production lot 22N* is executed (ST3G). In this example, as illustrated in FIG. 2B, the reel 8 of a component name B in which "ID" 20d is "0008" in the component inventory data 20C is allocated to the new production lot 22N*. Also, if the number of remaining components is smaller than the reference number, and insufficient, the component is excluded from the reservation target (ST3F). Then, after the reservation processing in (ST3G), it is determined whether (the number of necessary components–the number of reserved components)>0 is satisfied, or not, that is, whether the number of necessary components is larger than the number of reserved components, or not (ST3H).

In this example, if yes, that is, if the number of necessary components is larger than the number of reserved components, and also if the component is excluded from the reservation in (ST3F), the processing returns to (ST3B) in both of those cases, and the same processing is repetitively executed in the reel 8 of the subsequent ID. Then, if no in (ST3H), that is, if it is determined that the number of necessary components is smaller than the number of reserved components, and the processing is escaped from this closed processing loop, the reservation processing on the component of the component name is completed.

Then, it is determined whether the necessary component that has not completed the above-mentioned reservation processing is present, or not (ST3I). If yes, that is, if the necessary component that has not yet been subjected to the above-mentioned reservation processing is present, the processing is returned to (ST3A), and the same is repetitively executed in the following processing. Then, the reservation processing completion is confirmed in (ST3I) to complete the component reservation processing, and the processing returns to a main flow of FIG. 5.

That is, it is confirmed whether the missing component registered in (ST3E) is present, or not (ST4). If the missing component is present, a list indicative of the missing component is output by display using the display unit 17, or by printing using the printer 18 (ST5). At the same time, the number of producible mounting substrates, and an expected production interruption time when the component missing state is assumed are calculated when necessary, and appropriately output as occasion demands (ST6). Then, if the missing component is not present in (ST4), a fact that the components can be produced according to the plan is displayed on the display unit 17 (ST7), and a series of processing using the component reservation function is completed.

Figure 7:
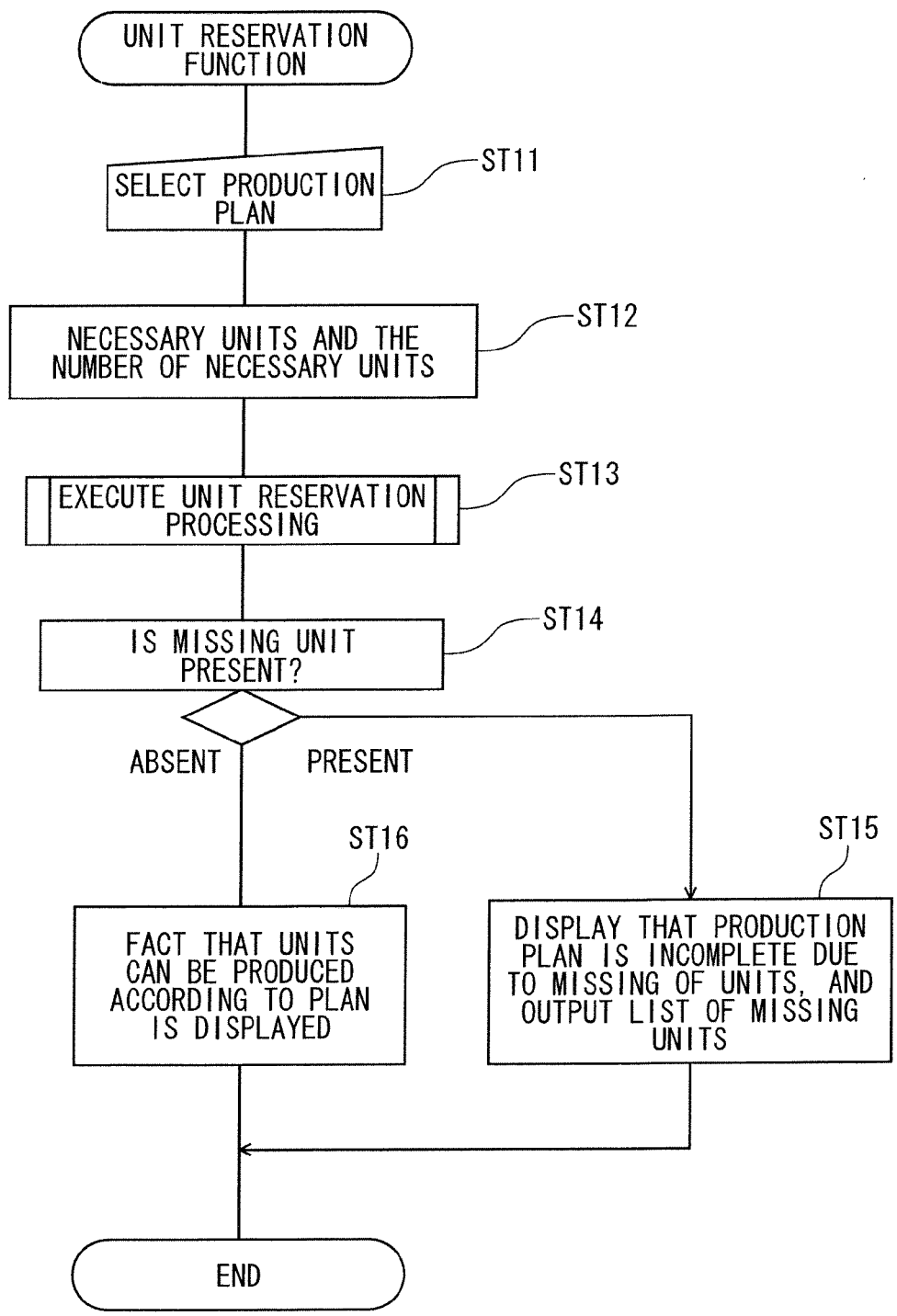
FIG. 7 is a flowchart illustrating a unit reservation function in the electronic component mounting system according to the embodiment of the present invention.
Figure 8:
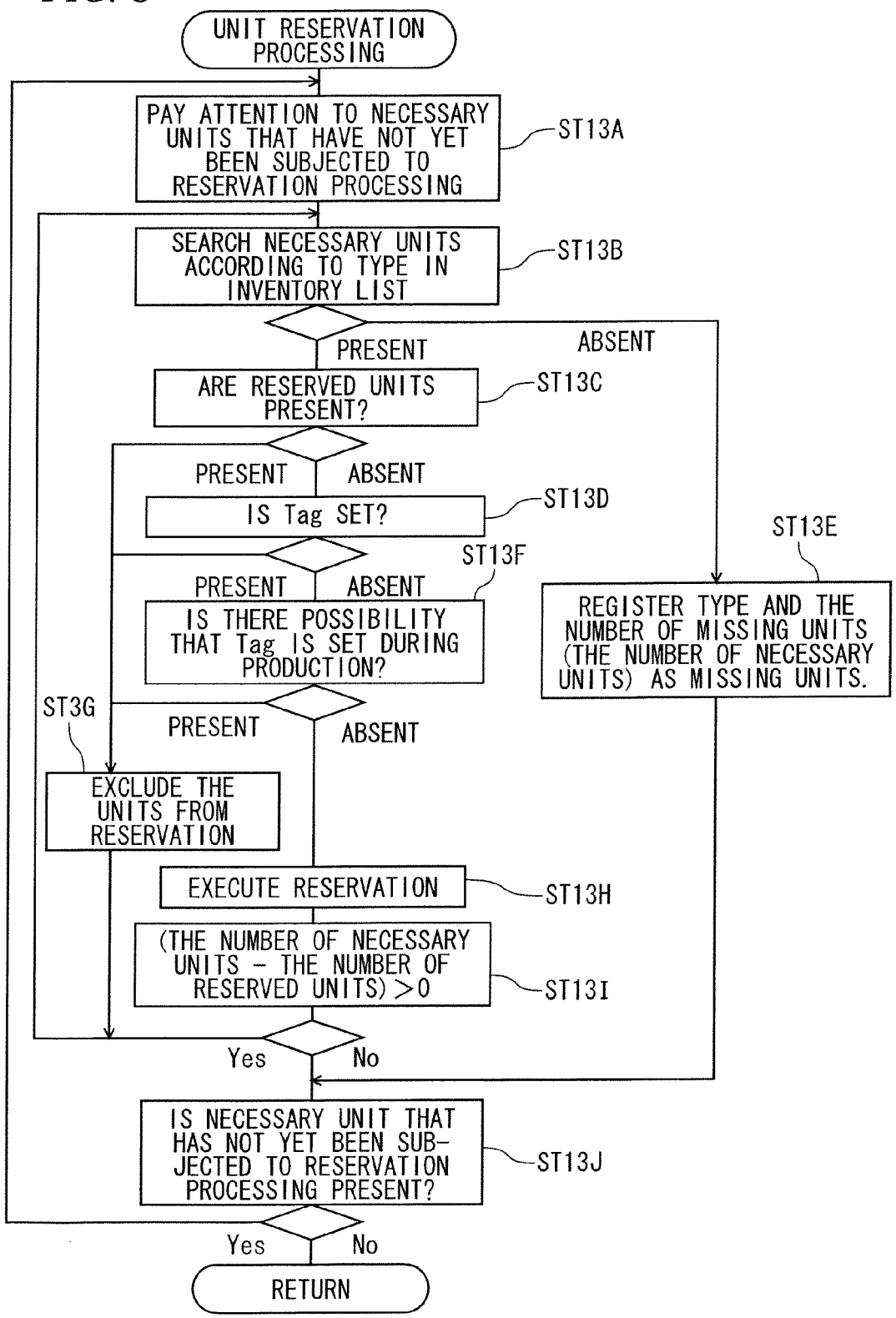
FIG. 8 is a flowchart illustrating the unit reservation function in the electronic component mounting system according to the embodiment of the present invention.

Subsequently, a description will be given of a unit reservation function conducted by the necessary unit data creation unit 13 and the unit reservation unit 14, which is used in the equipment unit management method of the electronic component mounting system 1, with reference to FIGS. 7 and 8. That is, the necessary unit data creation unit 13 conducts processing of creating necessary unit data indicative of the type and number of units used in the component mounting operation in the new production lot to be newly produced for each of the production lots on the basis of the production plan data 22 and the mounting data 23. The unit reservation unit 14 executes the new allocation processing of allocating the unit necessary for the production execution of the new production lot for the new production lot, on the basis of the necessary unit data created by the necessary unit data creation unit 13, and conducts the unit reservation processing of registering the allocated unit in the storage unit 5 as the inventory data storage unit.

Therefore, the necessary unit data creation unit 13 and the unit reservation unit 14 configure a unit reservation means for executing the new allocation processing of allocating the unit necessary for the production execution of the new production lot to be newly produced on the electronic component mounting line 2a for the new production lot, and conducts the unit reservation processing of registering the allocated unit in the storage unit 5 as the inventory data storage unit.

Then, the unit reservation means refers to the availability information on the unit to be allocated in the new allocation processing to determine whether the unit can be allocated to the new production lot, or not. If available, the unit reservation means conducts the unit reservation processing. Further, the use history data after the production of the new production lot has been executed is estimated on the basis of the production plan data 22 for the use history data of the unit to be subjected to the unit reservation processing, and if the estimated use history data arrives at the use limit data, the unit is not subjected to the unit reservation processing.

The allocation results in the production plan data 22 registered in the storage unit 5 includes information on the reserved production lot, and the production time of the production lot (refer to FIGS. 2A and 2B). The unit reservation unit 14 determines whether another production lot that is overlapping in the production time of the new production lot in the new allocation processing is present, or not, and conducts the unit reservation processing if not overlapping. Also, the unit reservation unit 14 conducts processing of outputting a list indicative of the missing units necessary for production of the new production lot if there is no unit allocatable to the inventory data 20 in the new allocation processing.

Subsequently, a description will be given of a unit reservation function that is executed by the unit reservation unit 14 with reference to FIG. 7. First, the production plan to be subjected to the unit reservation processing is selected with reference to the production plan data 22 stored in the storage unit 5 (ST11). As a result, the production lot 22N indicated in FIG. 4A is specified, and the respective data items of the "start date" 22a to "the number of productions" 22e of the component mounting operation intended for the production lot are acquired. Then, the necessary unit data, that is, the necessary units and the number of necessary units are calculated on the basis of the production plan data 22, the mounting data 23, and the component library 24 (ST12). The calculation processing is conducted by creating the necessary unit list that lists up the number of units necessary for each type of units necessary for the production lot. In this calculation processing, referring to the mounting data 23 corresponding to the "substrate name" 22d given by the production plan data 22, the component name and the number of components are acquired from the list of the "component name" 23c of the components mounted on the substrate of the substrate name. Further, the types of the "nozzle" 24b and the "feeder" 24c linked to the "component name" 24a in the component library 24 are specified, and the numbers of those necessary units are obtained by conducting estimation for each type of the units. The calculation processing is conducted by the necessary unit data creation unit 13.

Then, the unit reservation processing is executed by the unit reservation unit 14 (ST13). The unit reservation processing 14 executes the new allocation processing of allocating the unit necessary for the production execution of the new production lot to be newly produced for the new production lot, on the basis of the necessary unit data obtained in (ST12), and conducts the unit reservation processing of registering the allocation results in the storage unit 5 as the inventory data 20 (refer to FIGS. 2A and 2B).

Now, the unit reservation processing which is executed in (ST13) of FIG. 7 will be described with reference to FIG. 8. First, referring to the above-mentioned necessary unit list, attention is paid to the necessary unit whose reservation has not yet been completed to specify the unit to be subjected to the unit reservation processing (ST13A). Then, referring to the production plan data 22, the unit to be subjected to the reservation processing is searched according to the type in the nozzle inventory data 20A and the feeder inventory data 20B of the unit (nozzle, feeder) illustrated in FIG. 4A (ST13B). In this example, the unit which has already been reserved, or excluded from the reservation is excluded to conduct the search. Then, if the unit is not described in the nozzle inventory data 20A and the feeder inventory data 20B, it is determined that there is a possibility of missing unit occurrence in execution of the component mounting operation according to the production plan in the unit to be reserved, and the type of the unit and the number of missing units (the number of necessary units) are registered (ST13E).

Also, if it is found that the units of the type to be registered are described in the nozzle inventory data 20A and the feeder inventory data 20B according to the searched results in (ST13B), it is determined whether the reservation is present, or not (ST13C). That is, it is checked whether the unit of the type is reserved in another production lot 22N whose production time is overlapping in a time zone from the "start date" 22a to the "end date" 22b of the production lot 22N in which the use of the unit of the type has been reserved, or not.

Also, if there is no reservation in (ST13C), it is determined whether the "Tag" 21h indicated in FIG. 3B is set to "presence" in the unit, or not, with reference to the unit management data 21 (ST13D). In this example, if it is determined that there is no Tag setting, it is determined whether there is a possibility that the "Tag" 21h is set to "presence" during production, or not (ST13F). This determination is conducted by predicting a possibility that "adsorption error rate" 21c indicative of the use history of the unit, "the number of adsorptions" 21j defined in "feeder use history data" 21D, and "elapsed days/time from the previous maintenance" 21k arrive at the use limit reference defined by the nozzle use limit data 21A and the feeder use limit data 21B. That is, "the number of adsorptions" 21j and "elapsed days/time from the previous maintenance" 21k are estimated on the basis of the number of is productions 22e indicated by the production plan data 22, and the "predicted production time" 23d given by the mounting data 23, and comparing those estimated values with the respective use limit data.

If it is determined that there is no possibility of the Tag setting in (ST13F), the reservation processing of allocating the unit of the type to the new production lot 22N* is executed (ST13H). For example, as illustrated in FIG. 2A, the nozzle of the type "115" in which the "ID" 20a is "0004" is allocated to the new production lot 22N* in the nozzle inventory data 20A.

On the contrary, if the reservation is present in (ST13C), also if it is determined that there is the Tag setting in (ST13D), and further if it is determined that there is a possibility of the Tag setting in (ST13F), the unit of the type is excluded from the reservation in all of those cases (ST13G). That is, the unit reserving means estimates the use history data after the production of the new production lot has been executed on the basis of the production plan data, for the use history data of the units to be subjected to the unit reservation processing. If the estimated use history data arrives at the use limit data, the unit of the type is not subjected to the unit reservation processing.

Subsequently, after the reservation processing in (ST13H) has been executed, it is determined whether (the number of necessary units–the number of reserved units)>0 is satisfied, or not, that is, whether the number of necessary units of the type is larger than the number of reserved units, or not (ST13I). In this example, if yes, that is, if the number of necessary units is larger than the number of reserved units, and also if the units are excluded from the reservation in (ST13G), the processing returns to (ST13B) in both of those cases, and the same processing is repetitively executed in the units of the subsequent ID. Then, if no in (ST13I), that is, if it is determined that the number of necessary units of the type is smaller than the number of reserved units, and the processing is escaped from this closed processing loop, the reservation processing on the units of the type is completed. Then, it is determined whether the necessary unit that has not completed the above-mentioned reservation processing is present, or not (ST13J). If yes, that is, if the necessary unit that has not completed the above-mentioned reservation processing is present, the processing is returned to (ST13A), and the same is repetitively executed in the following processing. Then, the reservation processing completion is confirmed in (ST13J) to complete the unit reservation processing, and the processing returns to a main flow of FIG. 7.

That is, it is confirmed whether the missing unit registered in (ST3E) is present, or not (ST4). If the missing unit is present, a fact that the production plan is incomplete due to the missing of units is displayed on the display unit 17, and a list indicative of the missing unit is output by display using the display unit 17 or by printing using the printer 18 (ST15). Then, if the missing unit is not present in (ST14), a fact that the units can be produced according to the plan is displayed on the display unit 17 (ST16), and a series of processing using the unit reservation function is completed.

Figure 9:
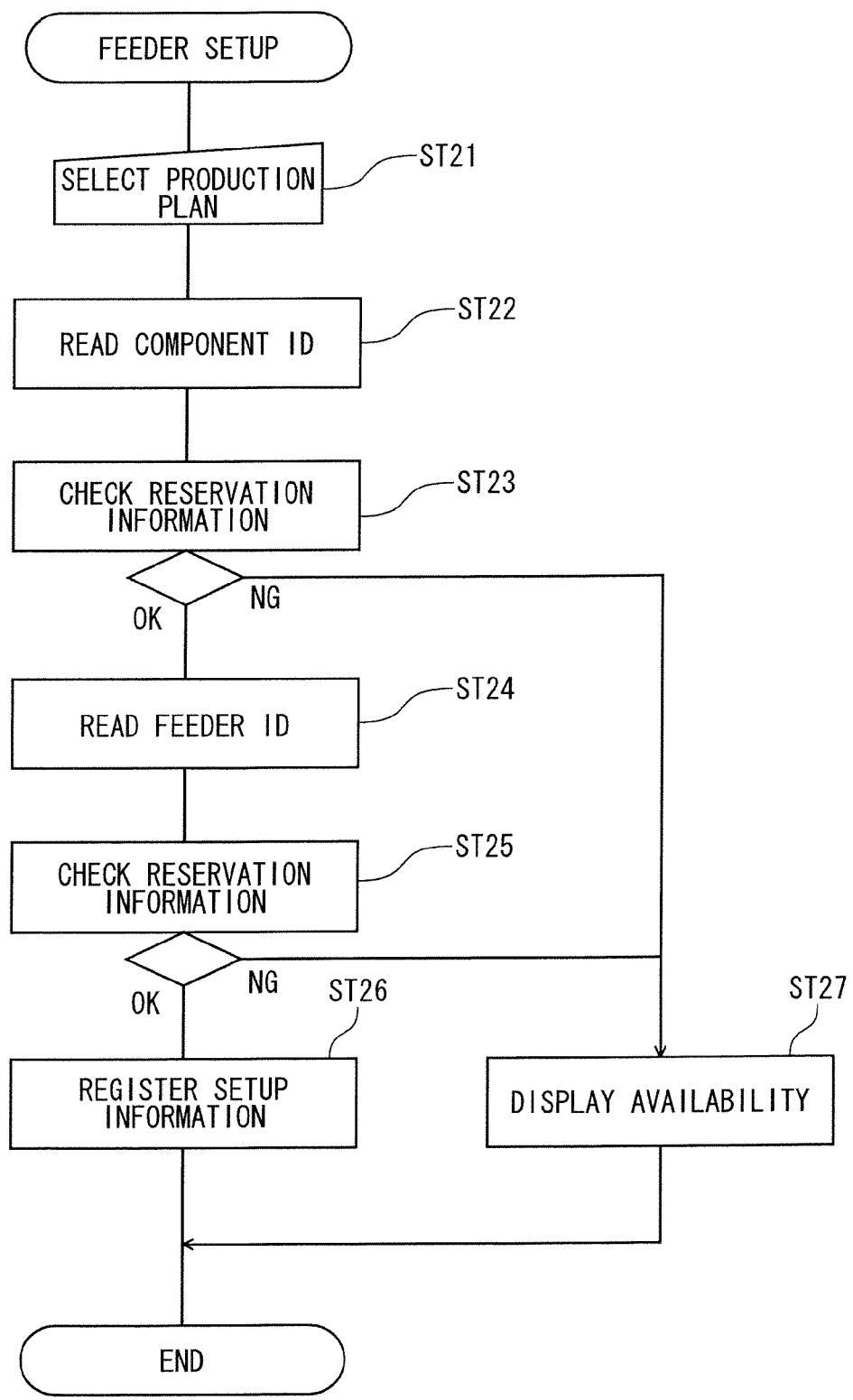
FIG. 9 is a flowchart illustrating feeder setup processing in the electronic component mounting system according to the embodiment of the present invention.

Subsequently, a description will be given of a feeder setup processing function conducted by the outer setup processing unit 15, which is used in the equipment unit management method of the electronic component mounting system 1, with reference to FIG. 9. That is, the outer setup processing unit 15 conducts processing of reading bar code data (component identification information) of a bar code label 10A stuck to the combined reel 8 (component), and bar code data (unit identification information) of a bar code label 10B stuck to the feeder 9 (unit) by the bar code reader 11 which is an identification information read unit, and registering the read data as the setup information in the inventory data 20 stored in the storage unit 5.

First, a production plan to be subjected to the feeder setup processing is selected with reference to the production plan data 22 stored in the storage unit 5 (ST21). Then, in the outer setup processing of setting the reel 8 in the feeder 9 in the outer setup area 7, the component ID is first read (ST22). That is, the bar code label 10A of the reel 8 to be set up is read by the bar code reader 11, and the read results is transmitted to the outer setup processing unit 15 of the mounting support system 4 through the receiving device 16. Then, the outer setup processing unit 15 refers to the component inventory data 20C of the inventory data 20 stored in the storage unit 5 to conduct reservation information checking for confirming whether the reel 8 corresponds to a correct component name allocated to the selected production lot and reserved, or not (ST23).

In this case, if the checking results are OK, that is, if the checking results match the reservation contents in the selected production lot, or are not described in the component inventory data 20C, and not scheduled in the production plan, feeder ID read is then executed (ST24). That is, the bar code label 10B of the feeder 9 to be set up is read by the bar code reader 11, and the read results are transmitted to the outer setup processing unit 15 of the mounting support system 4 through the receiving device 16. Then, the outer setup processing unit 15 refers to the feeder inventory data 20B of the inventory data 20 stored in the storage unit 5 to conduct reservation information checking for confirming whether the feeder 9 corresponds to a correct type allocated to the selected production, and reserved, or not (ST25).

In this case, if the checking results are OK, that is, if the checking results match the reservation contents in the selected production lot, or are not described in the feeder inventory data 20B, and not scheduled in the production plan, setup information in which the bar code data of the bar code label 10A and the bar code label 10B are combined together is registered in the inventory data 20 stored in the storage unit 5 (ST26). Also, if the checking results are NG in (ST23) and (ST25), that is, if the reservation is made in the production lot other than the selected production lot, a fact that the component and the unit are unavailable is displayed (ST27).

If the read component identification information has already been allocated to another production lot in the inventory data 20, the outer setup processing unit 15 prohibits the component from being registered in the setup information. Further, if the read unit identification information represents a unit that has already been allocated overlapping in the use time of another production lot in the inventory data 20, the outer setup processing unit 15 prohibits the component from being registered in the setup information. As a result, there occurs no case in which the scheduled equipment unit is diverted for another production lot, and a required number of units are missing with the results that the component mounting operation according to the production plan cannot be executed.

As described above, in the electronic component mounting system 1, and the electronic component/equipment unit management method of the electronic component mounting system 1 according to this embodiment, the necessary component data indicative of the type and number of electronic components, and the necessary unit data indicative of the type and number of equipment units, which are used in the component mounting operation, are obtained on the basis of the production plan data, the mounting data, and the component library for each of the production lots in advance. The new allocation processing of allocating the electronic component and the equipment unit necessary for the production execution of the new production lot to be newly produced on the electronic component mounting line on the basis of the necessary component data and the necessary unit data for the new production lot is executed. The component and unit reservation processing of reserving the allocation results in the inventory data storage unit is conducted.

Further, in the management of the equipment unit, the unit management data including the availability information indicative of the individual availability states of the equipment units is stored in advance, and in the unit reservation processing for executing the new allocation processing to register the allocation results, it is determined whether the equipment unit can be allocated to the new production lot with reference to the availability information on the equipment unit to be allocated. If available, the unit reservation processing is conducted.

As a result, even when a plurality of production lots is present for the same substrate type in the production plan, or even when general-purpose components and general-purpose equipment units are shared to the plurality of substrate types, the electronic components and the equipment units can be correctly allocated to the respective production lots according to the production plan. The electronic components and the equipment units used in the component mounting operation are appropriately managed to make it possible to correctly determine whether the production plan can be executed, or not. Also, a reduction in the device operation rate is prevented to make it possible to improve the productivity.

Further, a variety of data such as the inventory data 20, the unit management data 21, the production plan data 22, the mounting data 23, and the component library 24 configured as described above is stored in the storage unit 5 of the electronic component mounting system 1. Therefore, those pieces of data is referred to in an operation process of the electronic component mounting line 2a as needed, to thereby make it possible to prevent improper use of the electronic components and the equipment units in the production execution. For example, immediately before setup switching operation for switching the production substrate type to another is completed to start the production, the ID of the feeder or the nozzle loaded in the electronic component mounting device, and the ID of the component set in the feeder are read to confirm the conformance with the reservation information, or the availability, thereby being capable of removing the improper use. Further, those IDs are read in a status where the IDs can be confirmed, such as a component replenishment time during the line operation, a feeder exchange time, or a nozzle exchange time to conduct the same confirmation, as a result of which the proper use of the electronic components and the equipment units in the production execution can be always ensured.

The present invention has been described in detail and with reference to the specific embodiment. However, it would be apparent to an ordinary skilled person that various changes or modifications can be made without departing from the spirit and the scope of the present invention.

The present invention is based on Japanese Patent Application No. 2012-115303 filed on May 21, 2012, and content thereof is incorporated herein by reference.

INDUSTRIAL APPLICABILITY

The electronic component mounting system, and the component management method of the electronic component mounting system according to the present invention have such advantageous effects that the electronic components used in the component mounting operation are property managed so as to correctly determine whether the production plan can be executed, or not, and is useful in the electronic component mounting field in which the electronic components are mounted on the substrate to manufacture the mounting substrate.

LIST OF REFERENCE SIGNS 1, electronic component mounting system
2a, electronic component mounting line
5, storage unit
6, communication network
7, outer setup area
8, reel
9, feeder
10A, 10B, bar code labels
11, bar code reader
20A, nozzle inventory data
20B, feeder inventory data
20C, component inventory data
21A, nozzle use limit data
21B, feeder use limit data
21C, nozzle use history data
21D, feeder use history data

The invention claimed is:

1. An electronic component mounting system for mounting an electronic component on a substrate to manufacture a mounting substrate, the system comprising:
an electronic component mounting line configured to execute component mounting operation for mounting the electronic component;
a production plan data storage unit configured to store production plan data including at least a type of substrate, a production time, and number of productions for each production lot of the mounting substrate to be produced on the electronic component mounting line for a plurality of the production lots;
a mounting data storage unit configured to store mounting data indicative of a type and number of the electronic components used in the component mounting operation for each type of the substrates therein;
a necessary component data creating means for obtaining necessary component data indicative of a type and number of the electronic components used in the component mounting operation on the basis of the production plan data and the mounting data for each of the production lots;
an inventory data storage unit configured to store therein inventory data indicative of a stock status of the electronic components; and
a component reservation unit configured to execute new allocation processing of allocating electronic components necessary for production execution of the new production lot to be newly produced on the electronic component mounting line for the new production lot on the basis of the necessary component data, and conduct component reservation processing for registering allocated results in the inventory data storage unit, wherein the component reservation unit outputs a list indicative of missing components necessary for completing production of the new production lot together if there is no electronic component allocatable to the inventory data in the new allocation processing.

2. The electronic component mounting system according to claim 1, wherein the allocation results registered in the inventory data storage unit includes information on reserved production lot and a production time of the reserved production lot, and wherein the component reservation unit determines whether another production lot that is overlapping in production time of the new production lot in the new allocation processing is present, or not, and conducts the component reservation processing if not redundant.

3. The electronic component mounting system according to claim 1, further comprising: an identification information read unit configured to read component identification information for identifying and specifying electronic components, and unit identification information for identifying and specifying an equipment unit to be loaded in the electronic component mounting device; and an outer setup processing unit configured to read the component identification information on the electronic component and the unit identification information on the equipment unit combined with the electric component, by the identification information read unit, and register the read information as setup information, in outer setup operation for combining the equipment unit with the electronic component outside of the electronic component mounting device, wherein, if the read component identification information has already been allocated to another production lot in the inventory data, the outer setup processing unit inhibits the electronic component from being registered in the setup information.

4. A component management method in an electronic component mounting system for mounting an electronic component on a substrate to manufacture a mounting substrate, which manages an electronic component used in component mounting operation, the electronic component mounting system comprising: an electronic component mounting line configured to execute component mounting operation for mounting the electronic component; a production plan data storage unit configured to store production plan data including at least a type of substrate, a production time, and number of productions for each production lot of the mounting substrate to be produced on the electronic component mounting line for a plurality of the production lots; a mounting data storage unit configured to store therein mounting data defining a type and number of the electronic components used in the component mounting operation for each type of the substrates; a necessary component data creating means for obtaining necessary component data indicative of a type and number of the electronic components used in the component mounting operation on the basis of the production plan data and the mounting data for each of the production lots; and an inventory data storage unit configured to store inventory data indicative of a stock status of the electronic components therein, wherein component reservation processing for executing new allocation processing of allocating the electronic component necessary for production execution of new production lot to be newly produced on the electronic component mounting line for the new production lot on the basis of the necessary component data is conducted, and component reservation processing for registering the allocation results in the inventory data storage unit is conducted, wherein a list indicative of missing components necessary for completing the production of the new production lot together is output if there is no electronic component allocatable to the inventory data in the new allocation processing.

5. The component management method in an electronic component mounting system according to claim 4, wherein the allocation results includes information on reserved production lot and a production time of the reserved production lot, and wherein it is determined whether another production lot that is overlapping in production time of the new production lot in the new allocation processing is present, or not, and the component reservation processing is conducted if not overlapping.

6. The component management method in an electronic component mounting system according to claim 4, wherein the electronic component mounting system further comprises: an identification information read unit configured to read component identification information for identifying and specifying the electronic components, and unit identification information for identifying and specifying an equipment unit to be loaded in the electronic component mounting device; and an outer setup processing unit configured to read the component identification information on the electronic component and the unit identification information on the equipment unit combined with the electronic component, by the identification information read unit, and register the read information as setup information in outer set up operation for combining the equipment unit with the electronic component outside of the electronic component mounting device, and wherein, if the component identification information read in the outer setup operation has already been allocated to another production lot in the inventory data, the electronic component is inhibited from being registered in the setup information.

* * * * *